United States Patent
Tseng et al.

(10) Patent No.: US 7,989,237 B2
(45) Date of Patent: Aug. 2, 2011

(54) PACKAGE STRUCTURE FOR SOLID-STATE LIGHTING DEVICES AND METHOD OF FABRICATING THE SAME

(75) Inventors: Wen Liang Tseng, Hsinchu (TW); Lung Hsin Chen, Sinpu Township (TW)

(73) Assignee: Advances Optoelectronic Technology, Inc., Hsinchu Hsien (TW)

( * ) Notice: Subject to any disclaimer, the term of this patent is extended or adjusted under 35 U.S.C. 154(b) by 120 days.

(21) Appl. No.: 12/232,882

(22) Filed: Sep. 25, 2008

(65) Prior Publication Data
US 2009/0029494 A1      Jan. 29, 2009

Related U.S. Application Data

(62) Division of application No. 11/580,966, filed on Oct. 16, 2006.

(30) Foreign Application Priority Data

Oct. 21, 2005   (TW) ................................ 94136845 A (51) Int. Cl.
*H01L 33/00*       (2010.01)

(52) U.S. Cl. ................ 438/27; 438/48; 438/54; 438/69; 438/29; 438/26; 257/431; 257/448; 257/78; 257/294; 257/E22.058

(58) Field of Classification Search .................... 438/22, 438/15, 26, 27, 48, 54, 69; 257/431–448, 257/78–103, 290–294, E21.499, E33.056, 257/E33.058
See application file for complete search history.

(56) References Cited

U.S. PATENT DOCUMENTS

| | | | |
|---|---|---|---|
| 6,531,328 B1* | 3/2003 | Chen ............................... | 438/26 |
| 2004/0211970 A1* | 10/2004 | Hayashimoto et al. .......... | 257/98 |
| 2006/0208271 A1* | 9/2006 | Kim et al. ...................... | 257/100 |

* cited by examiner

*Primary Examiner* — Cuong Q Nguyen
*Assistant Examiner* — Cathy N Lam
(74) *Attorney, Agent, or Firm* — Raymond J. Chew (57) ABSTRACT

Silicon substrates are applied to the package structure of solid-state lighting devices. Wet etching is performed to both top and bottom surfaces of the silicon substrate to form reflecting cavity and electrode access holes. Materials of the reflecting layer and electrode can be different from each other whose preferred materials can be chosen in accordance with a correspondent function. Formation of the electrode can be patterned by an etching method or a lift-off method.

22 Claims, 6 Drawing Sheets

PACKAGE STRUCTURE FOR SOLID-STATE LIGHTING DEVICES AND METHOD OF FABRICATING THE SAME

CROSS-REFERENCE TO RELATED APPLICATIONS

This is a Division of application Ser. No. 11/580,966, filed Oct. 16, 2006, which claims priority of R.O.C. Patent Application No. 094136845, filed Oct. 21, 2005. The disclosure of the prior applications are hereby incorporated by reference herein in their entirety.

BACKGROUND

The present invention relates to a package structure for solid-state to lighting devices and a method of fabricating the same, and more particularly to a packaging and a fabricating method for a light emitting diode (LED) utilizing a silicon substrate.

LEDs are generally applied to the indication lamps of household appliances, lighting apparatuses, the back light modules of liquid crystal displays, browsers, third brake lights for vehicles, etc. Furthermore, linear light sources and planar light sources of LEDs are readily available these days.

Current, research and development in the field of LED focuses on the efficiency of light extraction and heat dissipation. To improve the extraction efficiency, the epitaxy process, wafer process and package process are the most important. The heat dissipation problem can be solved by improving the package structure. Hence, the improvement of the package structure has a great effect on both extraction efficiency and heat dissipation efficiency.

Figure 1:
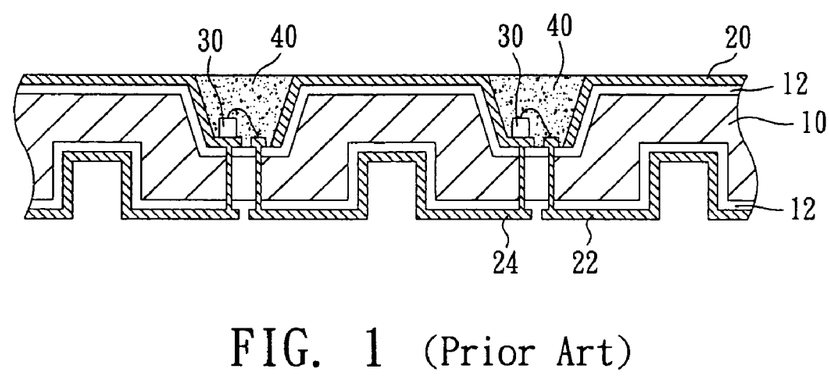
FIG. 1 is a diagram showing a conventional package structure for an LED.

There are several packaging types for LEDs, such as lamp and reflective cup. The LED utilizes the reflective cup to enhance the extraction efficiency by increasing the light reflection. In addition, modified designs of the reflective cup can also improve the heat dissipation efficiency. U.S. Pat. No. 6,562,643 put forth such a modified design, and U.S. Pat. No. 6,268,660 and U.S. patent publication No. 2004/0218390 have the same objectives. Moreover, U.S. Pat. No. 6,531,328 discloses that a silicon substrate 10 substitutes for a package substrate. A reflective cup is formed on the silicon substrate 10 by MEMS (micro electromechanical system) processes, as shown in FIG. 1. An insulation layer 12 and a metal layer 20 sequentially enclose the silicon substrate 10, and electrodes 22 and 24 are formed adjacent to the metal layer 20. An LED die 30 is attached to the interior of a reflective cup 50, and is electrically connected to the reflective cup 50 by bonding wires. Afterward, epoxy resin 40 encapsulates the LED die 30 in the reflective cup 50.

Figure 2:
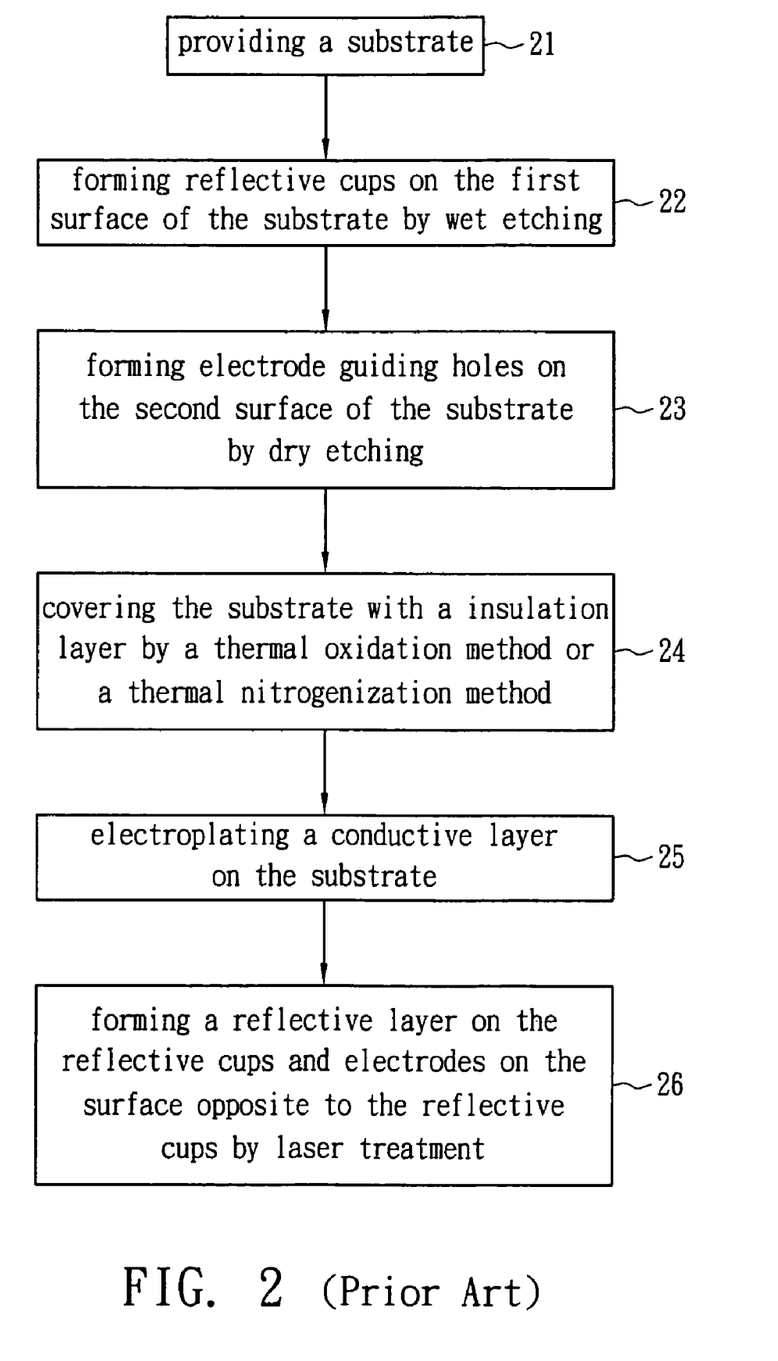
FIG. 2 is a flow chart for fabricating the package structure in FIG. 1.

FIG. 2 is a flow chart for manufacturing the devices in FIG. 1. As shown in Step 21, the silicon substrate 10 is first provided for these steps. Subsequently, a plurality of reflective cavities are formed on the first surface of the silicon substrate 10 by wet etching, as shown in Step 22. Referring to Step 23, electrode guiding holes are drilled on the second surface opposite to the first surface by dry etching. Insulation layers are deposited on the surfaces of the silicon substrate 10 by a thermal oxidation method or a thermal nitrogenization method according to the instruction in Step 24. The insulation layers can be made of $SiO_2$ or $Si_3N_4$. Subsequently, conductive layers are deposited on the insulation layers by electroplating, as shown in Step 25. Finally, a reflective layer is formed on the reflective cavities, and the electrodes 22 and 24 are arranged on the opposite surface by laser treatment.

However, the aforesaid structure of the LEDs on the silicon substrate has several shortcomings. First, the reflective layer and the electrodes are made of the same material. There is no metal simultaneously well-suited for both reflection and solderability. Furthermore, while the various LEDs emit light with different wavelengths, the reflective efficiency of the metal is directly related to the emitting wavelengths. Hence, the optimal material for the electrodes also varies with the emitting wavelengths. Solder is preferable for the material of the electrodes, but is not suitable for the material capable of reflecting visual light. Au, Ag, Pd and Pt are better reflective materials, but are not suitable for the electrodes.

In addition, the lowermost guiding holes are formed by dry etching. The etched pattern has less adaptability in subsequent processes. The metal layer needs laser treatment to form reflective surfaces, resulting in higher manufacturing costs.

Consequently, the optoelectronic market urgently needs a high power LED that has a reliable larger light area with a simple structure. The aforesaid problems have to be resolved with such a high power LED.

SUMMARY

An objective of the present invention is to provide a package structure for solid-state lighting devices and a method of fabricating the same. A silicon substrate is used as the package substrate to enhance heat dissipation efficiency. Furthermore, MEMS processes can be effectively applied to the substrate.

Another objective of the present invention is to allow the use of different materials for the reflective layer and electrodes. The material of the reflective layer is selected based on the requirement to reflect light of specific wavelengths without affecting the choice of electrode material. Therefore, optimal materials are respectively selected for the reflective layer and the electrodes.

Another objective of the present invention is to provide an insulating layer to protect the metal in the reflective layer from oxidation, vulcanization, or reaction with other chemical substances. The thickness of the insulating layer could be adjusted to produce constructive interference of specific rays.

Another objective of the present invention is to form electrodes via holes at the bottom of the device by wet etching to leave more space for subsequent process windows.

Another objective of the present invention is to utilize a simple lithographic process or a lift-off process for electrode fabrication that costs less than laser processing.

Another objective of the present invention is to utilize mature processes for each step to lower the manufacturing costs.

To achieve these objectives, the present invention discloses a package structure for a solid-state lighting device, comprising a silicon substrate having a first surface and a second surface, a first insulating layer enclosing the silicon substrate, a reflective layer, a second insulating layer disposed on the reflective layer, a first conducting layer serving as two electrode pads and electrically isolated from the reflective layer, and a second conducting layer. The first surface of silicon substrate is opposite to the second surface and has a reflective cavity thereon. The second surface has two electrode access holes thereon which go through the second surface to the reflective cavity. The reflective layer is disposed on the reflective cavity. The first conductive layer is configured on the two electrode access holes, serving as two electrode pads and electrically isolated from the reflective layer. The second conductive layer is disposed beneath the second surface and inside the two electrode access holes.

Figure 3:
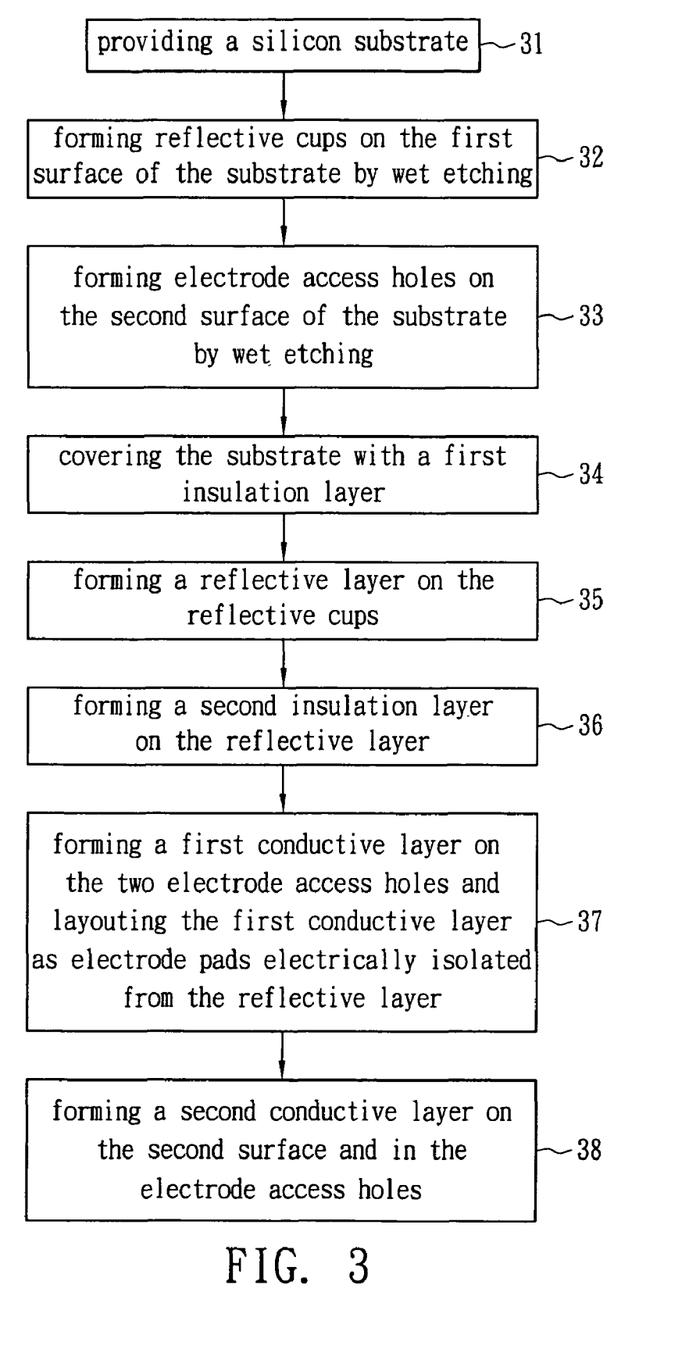
FIG. 3 is a flow chart for fabricating the package structure in accordance with the present invention.

The present invention also discloses a method for fabricating a package structure for a solid-state lighting device. As shown in FIG. 3, the method comprises the steps of: providing a silicon substrate and forming a reflective cavity on a first surface of the silicon substrate by wet etching; forming two electrode access holes on a second surface of the silicon substrate by wet etching which go through the silicon substrate to the reflective cavity, wherein the second surface is opposite to the first surface; overlaying a first insulating layer on the silicon substrate; forming a reflective layer on the reflective cavity and forming a second insulating layer on said reflective layer; forming a first conductive layer on the two electrode access holes, wherein the first conductive layer serves as two electrode pads and is electrically isolated from the reflective layer; and forming a second conductive layer beneath the second surface and inside the two electrode access holes.

BRIEF DESCRIPTION OF THE DRAWINGS

The invention will be described according to the appended drawings in which.

DETAILED DESCRIPTION OF EMBODIMENTS

The present invention discloses a package structure for solid-state lighting devices, comprising a silicon substrate having a first surface and a second surface, a first insulating layer enclosing the silicon substrate, a reflective layer, a second insulating layer disposed on the reflective layer, a first conducting layer serving as two electrode pads and electrically isolated from the reflective layer, and a second conducting layer. The first surface of silicon substrate is opposite to the second surface and has a reflective cavity thereon. The second surface has two electrode access holes thereon which go through the second surface to the reflective cavity. The reflective layer is disposed on the reflective cavity. The first conductive layer is configured on the two electrode access holes, serving as two electrode pads and electrically isolated from the reflective layer. The second conductive layer is disposed beneath the second surface and inside the two electrode access holes.

The present invention also discloses a method for fabricating a package structure for a solid-state lighting device. As shown in FIG. 3, the method comprises the steps 31-38 of: providing a silicon substrate and forming a reflective cavity on a first surface of the silicon substrate by wet etching; forming two electrode access holes on a second surface of the silicon substrate by wet etching which go through the silicon substrate to the reflective cavity, wherein the second surface is opposite to the first surface; overlaying a first insulating layer on the silicon substrate; forming a reflective layer on the reflective cavity and forming a second insulating layer on said reflective layer; forming a first conductive layer on the two electrode access holes, wherein the first conductive layer serves as two electrode pads and is electrically isolated from the reflective layer; and forming a second conductive layer beneath the second surface and inside the two electrode access holes.

The first insulating layer can be silicon oxide formed on the silicon substrate by thermal oxidation or chemical vapor deposition, preferably by thermal oxidation. The reflective layer can be silver, aluminum, gold or tin, depending on the wavelengths of designated light. The first conductive layer and the second conductive layer are made of solderable materials and are electrically connected. The first conductive layer and the second conductive layer are formed through patterning resulting from etching or lift-off. The second insulating layer is silicon oxide deposited on the reflective layer by chemical vapor deposition, or more particularly, by plasma enhanced chemical vapor deposition. The two electrode access holes are formed by wet etching. The solid-state lighting device is a light-emitting diode or a laser diode. The package structure of the invention can be applicable to wire bonding or flip chip packaging.

The aforesaid package structure for solid-state lighting device and its fabrication method further comprise two more electrode access holes which are through holes reaching to the reflective cavity. Thus the first conductive layer includes four electrode pads, whereas the second conductive layer is disposed inside the four electrode access holes and electrically connected to the four electrode pads. The reflective layer is formed by electroplating, evaporating or electron-beam epitaxy.

FIGS. 4-13 are cross-sectional diagrams respectively corresponding to each step of fabrication in accordance with the present invention.

Figure 4:
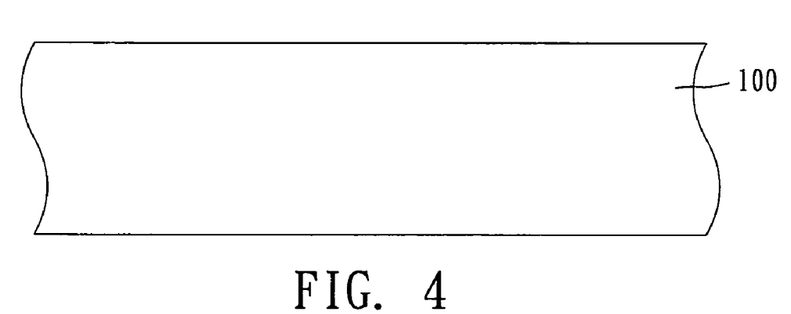
FIGS. 4-13 are cross-sectional diagrams respectively corresponding to each step of fabrication in accordance with the present invention.

As shown in FIG. 4, a silicon substrate 100 has a first surface and a second surface, wherein the first surface is the upper surface and the second surface is the lower surface. The silicon substrate 100 can be a 5-inch, 6-inch, 8-inch or 12-inch wafer. It can have a <100> crystal orientation surface. A few important advantages offered by silicon substrate are good heat dissipation and suitability for well-developed MEMS processing.

Figure 5:
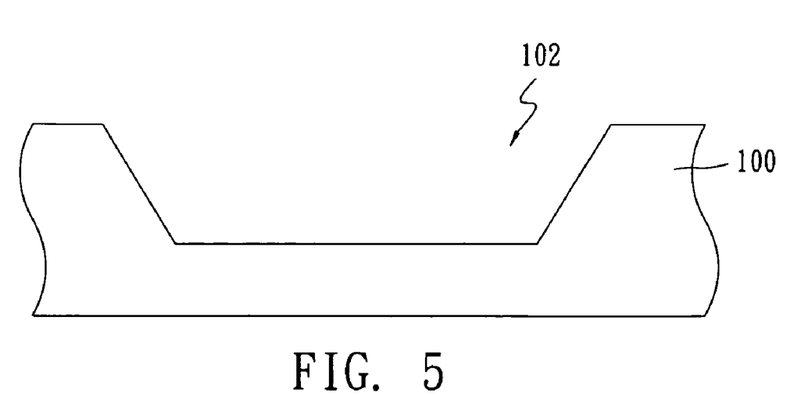

As shown in FIG. 5, a reflective cavity 102 is formed on the first surface of silicon substrate 100 by wet etching. The solvent used for wet etching the silicon substrate 100 can be potassium hydroxide (KOH). This step should be performed by using the photolithography process. That is, etching is completed by pattern transfer through the steps of resist coating, soft baking, exposure, development, hard baking, etching, and resist removal. The etched profile of reflective cavity 102 formed by wet etching is adjustable due to the isotropicity of wet etching.

Figure 6:
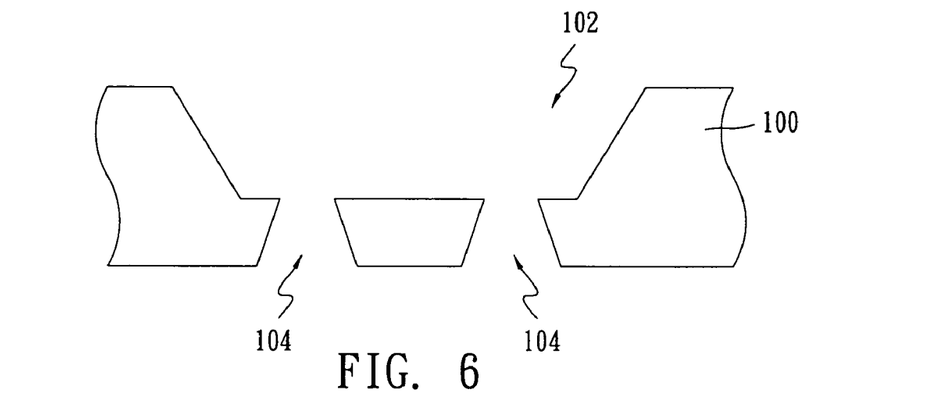

As shown in FIG. 6, in the successive steps, electrode access holes 104 are formed on the second surface of the silicon substrate 100 by wet etching. The number of the electrode access holes 104 is two or more. It could also be four or six, especially when more than two lighting devices are employed. The electrode access holes 104 formed by wet etching have larger openings to provide more tolerance for subsequent process windows. Similarly, this step is included in a photolithography process.

Figure 7:
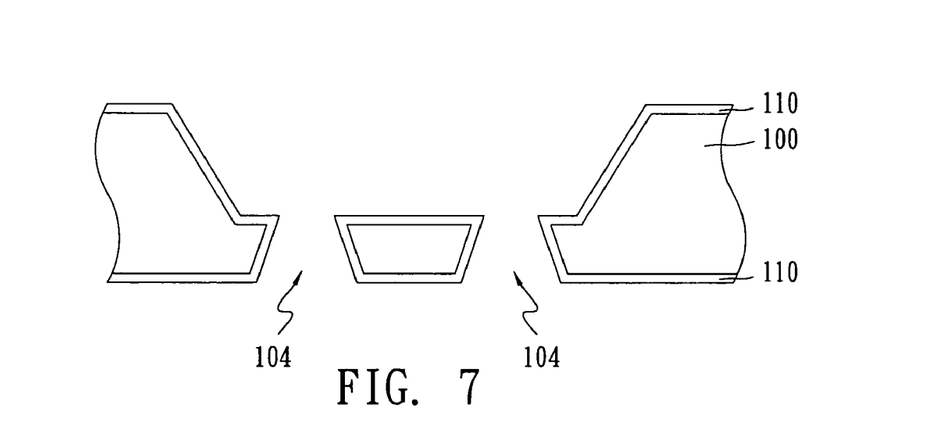

As shown in FIG. 7, a silicon oxide layer is formed over the silicon substrate 100 as a first insulating layer 110. The silicon oxide layer can be formed on the silicon substrate 100 by thermal oxidation or chemical vapor deposition, preferably by thermal oxidation, for it results in more compact structure. In this invention, either dry or wet thermal oxidation can be employed. In addition, the first insulating layer 110 can be silicon nitride. The first insulating layer 110 encloses the silicon substrate 100, and covers the inner surfaces of the electrode access holes 104.

Figure 8:
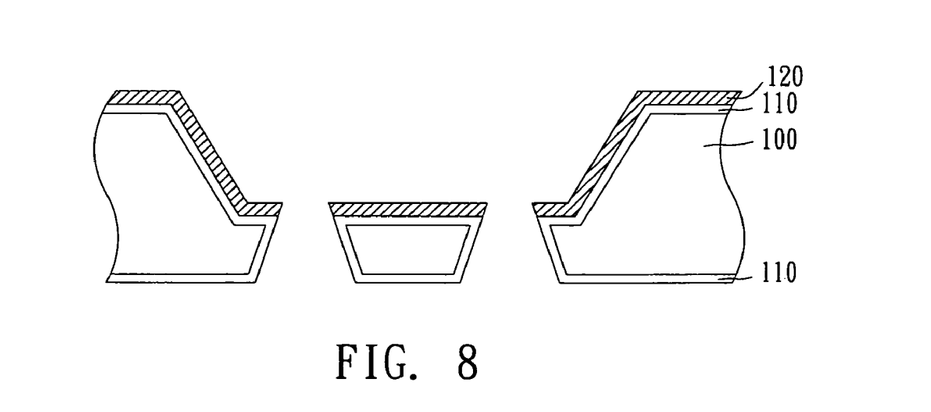

As shown in FIG. 8, a reflective layer 120 is formed on the reflective cavity 102. The reflective layer 120 is made of silver, aluminum, gold or tin, depending on the wavelengths of light used. The reflective layer 120 is to formed by electroplating, evaporating or electron-beam epitaxy. Because the reflective layer 120 is deposited over the first surface of silicon substrate 100, its process conditions are simpler. In addition, after the formation of the reflective layer 120, portions of the reflective layer 120 outside the reflective cavity 102 can be removed by etching. This step is optional.

Figure 9:
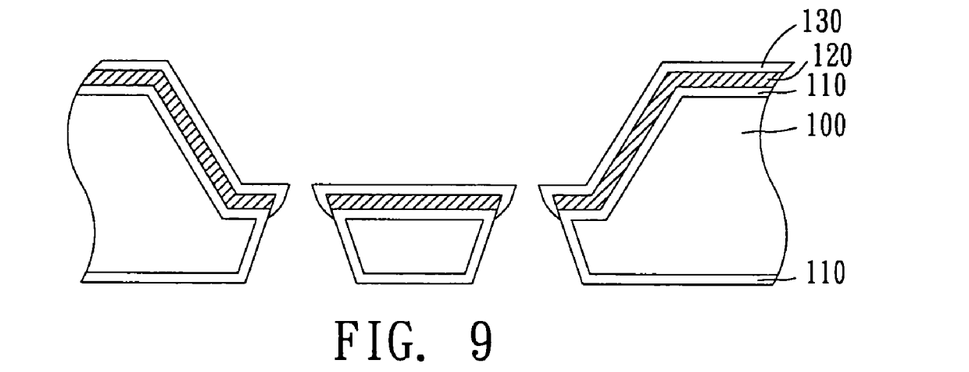

As shown in FIG. 9, a second insulating layer 130 is overlaid on the reflective layer 120. The second insulating layer 130 is made of silicon oxide or silicon nitride by chemical vapor deposition, wherein plasma enhanced chemical vapor deposition is used for the deposition of silicon oxide, and low-pressure chemical vapor deposition is used for the deposition of silicon nitride. The thickness of deposition can be adjusted to produce constructive interference of specific light beams. The reflective layer 120 is coated by the second insulating layer 130 for protection against oxidation, vulcanization, or reaction of reflective metal with other chemical substances. The presence of coating is important especially if the reflective metal used is aluminum or tin, because those two metals are prone to oxidation.

Figure 10:
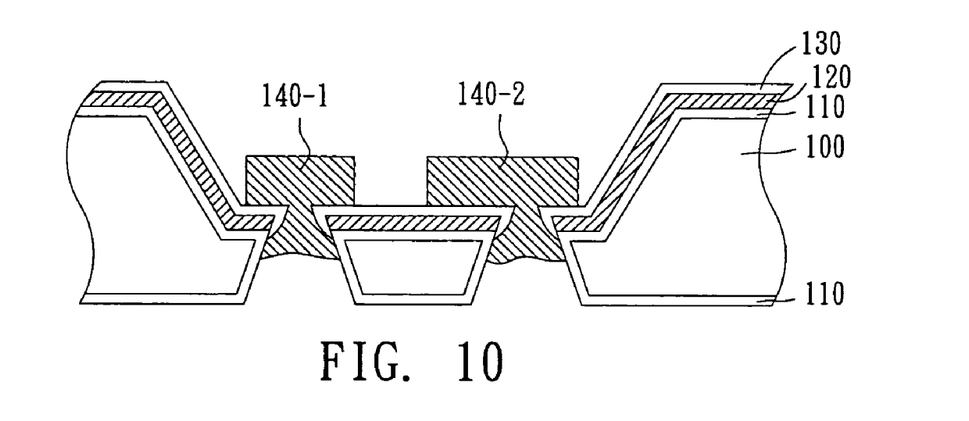

As shown in FIG. 10, a first metal layer is formed as top electrodes 140-1 and 140-2. The top electrodes 140-1 and 140-2 are solderable material as determined by subsequent processes, for example, wire bonding or flip chip bonding, because top electrodes are soldered to the lighting device. The top electrodes 140-1 and 140-2 may be formed by electroplating or evaporating. The pattern of top electrodes 140-1 and 140-2 is formed by etching or lift-off. The lift-off and the etching are similar pattern transfer processes, but proceeded in different sequence. In the lift-off process, a photoresist layer is first formed, followed by exposure and development to deposit a metal layer on the photoresist layer. In subsequent removal of a photoresist layer, the metal layer on the photoresist will be removed together. The lift-off process does not require an additional etching step to remove the metal layer. Thus it requires one fewer step than the etching process. In any case, either the etching process or the lift-off process is a mature process and costs less than conventional laser processing.

Because of the presence of a second insulating layer 130, the top electrodes 140-1 and 140-2 are electrically isolated from the reflective layer 120 to prevent electricity leakage from damaging the device.

Figure 11:
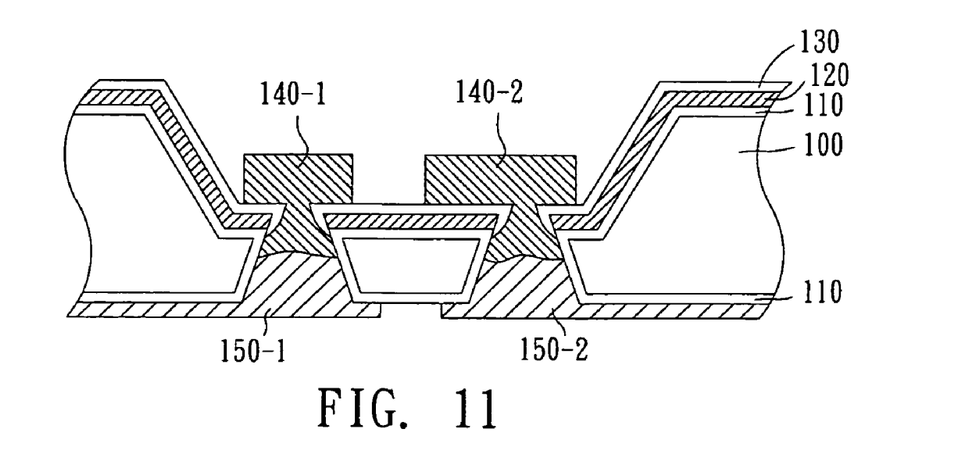

As shown in FIG. 11, a second metal layer is formed as bottom electrodes 150-1 and 150-2. The bottom electrodes 150-1 and 150-2 are solderable materials or regular electrode materials. The bottom electrodes 150-1 and 150-2 are formed in the same manner as the top electrodes 140-1 and 140-2. If the bottom electrodes 150-1 and 150-2 are formed by pattern transfer, the formation method used can be the same or different from that of top electrodes 140-1 and 140-2. The bottom electrodes 150-1 and 150-2 are electrically connected to the top electrodes 140-1 and 140-2 through the electrode access holes 104 filled with conductive materials.

Figure 12:
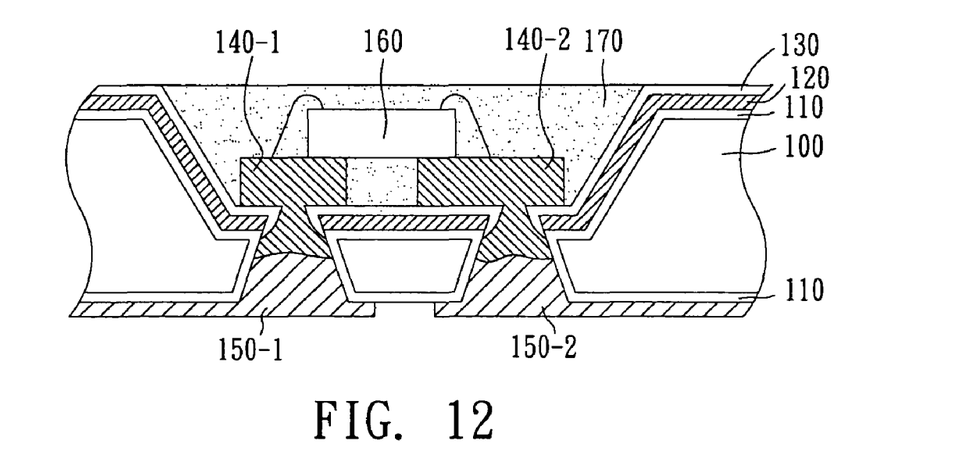

As shown in FIG. 12, the LED 160 is sealed with an epoxy resin 170 after wire bonding. The epoxy resin 170 may be blended with fluorescent powder. The fluorescent powder could be from a YAG group or a silicate group. The sealing of the epoxy resin 170 is achieved by transfer molding or dispensing.

Figure 13:
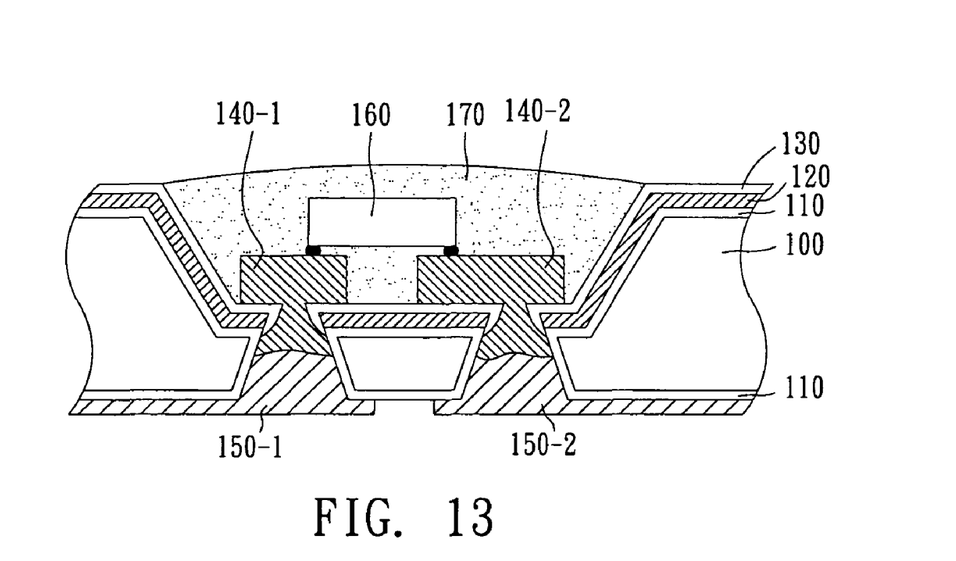

As shown in FIG. 13, the LED 160 is sealed with the epoxy resin 170 after flip chip bonding. Similarly, the epoxy resin 170 may be blended with fluorescent powder, which comes from the YAG group or the silicate group. The sealing of epoxy resin 170 is achieved by transfer molding or dispensing.

The use of a silicon substrate for packaging enhances heat dissipation efficiency and is suitable for MEMS processes. Because the materials for the reflective layer and the electrodes can be different where the material of reflective layer is selected based on the need to reflect light of specific wavelengths without affecting the choice of electrode material, optimal materials are respectively selected for the reflective layer and the electrodes. The present invention also provides an insulating layer to protect the metal in the reflective layer from oxidation, vulcanization or reaction with other chemical substances. The thickness of said insulating layer could be adjusted to produce constructive interference of specific light rays. The invention uses wet etching to form the electrode access holes at the bottom of the silicon substrate to make more room for the subsequent process window. The invention employs a simple lithographic or a lift-off process for electrode fabrication, which costs less than laser processing. The invention uses mature process in each step. Thus its overall cost is lower.

The above-described embodiments of the present invention are intended to be illustrative only. Numerous alternative embodiments may be devised by persons skilled in the art without departing from the scope of the following claims.

What is claimed is:

1. A fabrication method of a package structure for solid-state lighting devices, comprising the steps of:
   providing a silicon substrate;
   forming a reflective cavity on a first surface of the silicon substrate by wet etching;
   forming at least two electrode access holes on a second surface of the silicon substrate by wet etching, wherein the electrode access holes go through the silicon substrate to reach the reflective cavity and the second surface is opposite to the first surface;
   enclosing a first insulating layer on the silicon substrate and covering the first insulating layer on inner surfaces of the electrode access holes;
   overlaying a reflective layer on the reflective cavity;
   overlaying a second insulating layer on the reflective layer and the first insulating layer;
   forming a first conductive layer on the electrode access holes, wherein the first conductive layer serves as two electrode pads and is electrically isolated from the reflective layer; and
   forming a second conductive layer beneath the second surface and inside the electrode access holes, wherein the material of the reflective layer is different from the materials of the first conductive layer and the second conductive layer.

2. The method of claim 1, wherein the first insulating layer is made of silicon oxide formed by thermal oxidation.

3. The method of claim 1, wherein the reflective layer is made of silver, aluminum, gold or tin.

4. The method of claim 3, wherein the reflective layer is formed by electroplating, evaporating or electron-beam epitaxy.

5. The method of claim 1, wherein the first conductive layer and the second conductive layer are made of a solderable material.

6. The method of claim 5, wherein the first conductive layer and the second conductive layer are fabricated by pattern transfer accompanied by etching or lift-off.

7. The method of claim 1, wherein the second insulating layer is made of silicon oxide formed by chemical vapor deposition.

8. The method of claim 1, wherein the electrode access holes are formed after the second surface is etched by wet etching, and the number of the electrode access holes is four.

9. The method of claim 8, wherein the first conductive layer serves as four electrode pads, and the second conductive layer is disposed inside the four electrode access holes and electrically connected to the first conductive layer.

10. The method of claim 1, wherein the solid-state lighting device is a light-emitting diode.

11. The method of claim 10, wherein the thickness of the second insulating layer is adjusted to produce constructive interference of specific light emitted from the light-emitting diode.

12. A fabrication method of a package structure for solid-state lighting devices, comprising the steps of:
providing a silicon substrate;
forming a reflective cavity on a first surface of the silicon substrate by wet etching;
forming at least two electrode access holes on a second surface of the silicon substrate by wet etching, wherein the electrode access holes go through the silicon substrate to reach the reflective cavity and the second surface is opposite to the first surface;
enclosing a first insulating layer on the silicon substrate and covering the first insulating layer on inner surfaces of the electrode access holes;
overlaying a reflective layer on a portion of the first insulating layer located in the reflective cavity;
overlaying a second insulating layer on the reflective layer and the first insulating layer, a portion of the reflective layer adjacent to the electrode access holes being sealed by the first insulating layer and the second insulating layer;
forming a first conductive layer on the electrode access holes, wherein the first conductive layer serves as two electrode pads and is electrically isolated from the reflective layer, wherein the first insulating layer and the second insulating layer isolate the first conductive layer from the reflective layer;
forming a second conductive layer beneath the second surface and inside the two electrode access holes; and
mounting an LED die on the first conductive layer and electrically connecting the two electrode pads.

13. The method of claim 12, further comprising a step of electrically connecting the LED die to the first conductive layer.

14. The method of claim 13, wherein the LED die is electrically connected to the first conductive layer by wire bonding or flip-chip bonding.

15. The method of claim 13, further comprising a step of overlaying an epoxy resin on the LED die and the reflective cavity.

16. The method of claim 15, wherein the epoxy resin is blended with fluorescent powder.

17. The method of claim 15, wherein the epoxy resin is filled into the reflective cavity by transfer molding or dispensing.

18. The method of claim 14, wherein the thickness of the second insulating layer is adjusted to produce constructive interference of specific light emitted from the LED die.

19. The method of claim 12, wherein the first conductive layer and the second conductive layer are made of a solderable material.

20. The method of claim 19, wherein the first conductive layer and the second conductive layer are fabricated by pattern transfer accompanied by etching or lift-off.

21. The method of claim 1, wherein the reflective layer is overlaid on a portion of the first insulating layer located in the reflective cavity, a portion of the reflective layer adjacent to the electrode access holes being sealed by the first insulating layer and the second insulating layer, the first insulating layer and the second insulating layer isolating the first conductive layer from the reflective layer.

22. The method of claim 15, wherein the material of the reflective layer is different from the materials of the first conductive layer and the second conductive layer.

* * * * *